US007242069B2

(12) United States Patent
Bui et al.

(10) Patent No.: US 7,242,069 B2
(45) Date of Patent: Jul. 10, 2007

(54) THIN WAFER DETECTORS WITH IMPROVED RADIATION DAMAGE AND CROSSTALK CHARACTERISTICS

(75) Inventors: Peter Steven Bui, Westminster, CA (US); Narayan Dass Taneja, Long Beach, CA (US)

(73) Assignee: UDT Sensors, Inc., Hawthorne, CA (US)

( * ) Notice: Subject to any disclaimer, the term of this patent is extended or adjusted under 35 U.S.C. 154(b) by 99 days.

(21) Appl. No.: 10/838,987

(22) Filed: May 4, 2004

(65) Prior Publication Data

US 2004/0222358 A1    Nov. 11, 2004

Related U.S. Application Data

(60) Provisional application No. 60/468,181, filed on May 5, 2003.

(51) Int. Cl.
*H01L 31/00*    (2006.01)

(52) U.S. Cl. .................. 257/443; 257/414; 257/428; 257/431; 257/E31.001; 438/48; 438/57; 438/64; 438/66

(58) Field of Classification Search ............. None
See application file for complete search history.

(56) References Cited

U.S. PATENT DOCUMENTS

| 4,874,939 A | 10/1989 | Nishimoto et al. |
|---|---|---|
| 4,887,140 A | 12/1989 | Wang |
| 4,904,608 A | 2/1990 | Gentner et al. |
| 4,904,861 A | 2/1990 | Epstein et al. |
| 4,998,013 A | 3/1991 | Epstein et al. |
| 5,144,379 A | 9/1992 | Eshita et al. |
| 5,214,276 A | 5/1993 | Himoto et al. |
| 5,237,197 A | 8/1993 | Snoeys et al. |
| 5,252,142 A | 10/1993 | Matsuyama et al. |
| 5,408,122 A | 4/1995 | Reele |
| 5,430,321 A | 7/1995 | Effelsberg |
| 5,446,751 A | 8/1995 | Wake |
| 5,576,559 A | 11/1996 | Davis |
| 5,599,389 A | 2/1997 | Iwasaki |
| 5,818,096 A | 10/1998 | Ishibashi et al. |
| 5,825,047 A | 10/1998 | Ajisawa et al. |
| 5,869,834 A | 2/1999 | Wipenmyr |
| 5,923,720 A | 7/1999 | Barton et al. |

(Continued)

FOREIGN PATENT DOCUMENTS

EP    0 347 157    12/1989

(Continued)

*Primary Examiner*—Leonardo Andujar
*Assistant Examiner*—Kevin Quinto
(74) *Attorney, Agent, or Firm*—Patent metrix (57) ABSTRACT

The present invention provides for reduced radiation damage susceptibility, decreased affects of crosstalk, and increased flexibility in application. In one embodiment, the present invention includes a back side illuminated photodiode array with a back side etching that minimizes the active area layer, thereby decreasing the affects of crosstalk. The back side etching is preferably, but by no way of limitation, in the form of "U" or "V" shaped grooves. The back side illuminated with back side etching (BSL-BE) photodiodes are implemented in an array and have superior performance characteristics, including less radiation damage due to a thinner active area, and less crosstalk due to shorter distances for minority carriers to diffuse to the PN junction.

17 Claims, 6 Drawing Sheets

U.S. PATENT DOCUMENTS

| | | |
|---|---|---|
| 6,027,956 A * | 2/2000 | Irissou .................. 438/68 |
| 6,218,684 B1 | 4/2001 | Kuhara et al. |
| 6,326,649 B1 | 12/2001 | Chang et al. |
| 6,352,517 B1 | 3/2002 | Flock et al. |
| 6,426,991 B1 | 7/2002 | Mattson et al. |
| 6,438,296 B1 | 8/2002 | Kongable |
| 6,489,635 B1 | 12/2002 | Sugg |
| 6,504,158 B2 | 1/2003 | Possin |
| 6,510,195 B1 * | 1/2003 | Chappo et al. |
| 6,546,171 B2 | 4/2003 | Fukutomi |
| 6,569,700 B2 | 5/2003 | Yang |
| 6,670,258 B2 | 12/2003 | Carlson et al. |
| 6,734,416 B2 | 5/2004 | Carlson et al. |
| 2002/0056845 A1 | 5/2002 | Iguchi et al. |
| 2004/0104351 A1 * | 6/2004 | Shibayama |

FOREIGN PATENT DOCUMENTS

| | | |
|---|---|---|
| EP | 0 723 301 A2 | 5/1997 |
| EP | 0 723 301 B1 | 7/2000 |
| EP | 1 069 626 A2 | 1/2001 |
| EP | 1 205 983 A1 | 5/2002 |
| WO | WO00/52766 | 9/2000 |

* cited by examiner

THIN WAFER DETECTORS WITH IMPROVED RADIATION DAMAGE AND CROSSTALK CHARACTERISTICS

CROSS REFERENCE TO RELATED APPLICATIONS

This invention relies on, for priority, U.S. Provisional Application 60/468,181, having a priority date of May 5, 2003, entitled "DETECTORS WITH IMPROVED RADIATION DAMAGE AND CROSSTALK CHARACTERISTICS".

FIELD OF THE INVENTION

The present invention pertains generally to the field of radiation detectors, and in particular, relates to radiation detectors manufactured with thinner wafers, thereby yielding reduced crosstalk between detecting regions and decreased susceptibility to radiation damage, having front surface contacts.

BACKGROUND OF THE INVENTION

Arrays of photosensitive diodes are used in an assortment of applications including, but not limited to, radiation detection, optical position encoding, and low light-level imaging, such as night photography, nuclear medical imaging, photon medical imaging, multi-slice computer tomography (CT) imaging, and ballistic photon detection etc. Typically, photodiode arrays may be formed as one- or two-dimensional arrays of aligned photodiodes, or, for optical shaft encoders, a circular or semicircular arrangement of diodes.

One problem with detection devices is that they are susceptible to various radiation damage mechanisms, such as displacement damage resulting in total dose effects and ionization damage resulting in bulk effects. Both these mechanisms adversely affect the performance of detectors, transistors and integrated circuits.

Certain detector characteristics that are most affected include detector leakage current, doping characteristics, charge collection, and carrier lifetime. Over time, detectors show an increased reverse-bias current and increased forward voltage drop due to radiation damage. Further, a change in doping level, due to radiation damage, adversely affects the width of the depletion region, i.e. the voltage required for full depletion and a decrease in carrier lifetime results in signal loss as carriers recombine while traversing the depletion region.

Another disadvantage with conventional detection devices is the amount and extent of crosstalk that occurs between adjacent detector structures, primarily as a result of minority carrier leakage current between diodes. The problem of crosstalk between diodes becomes even more acute as the size of the detector arrays, the size of individual detectors, the spatial resolution, and spacing of the diodes is reduced.

In certain applications, it is desirable to produce optical detectors having small lateral dimensions and spaced closely together. For example in certain medical applications, it would beneficial to increase the optical resolution of a detector array in order to permit for improved image scans, such as computer tomography scans. However, at conventional doping levels utilized for diode arrays of this type, the diffusion length of minority carriers generated by photon interaction in the semiconductor is in the range of at least many tens of microns, and such minority carriers have the potential to affect signals at diodes away from the region at which the minority carriers were generated. Therefore, the spatial resolution obtainable may be limited by diffusion of the carriers within the semiconductor itself, even if other components of the optical system are optimized and scattered light is reduced.

Various approaches have been used to minimize such crosstalk including, but not limited to, providing inactive photodiodes to balance the leakage current, as described in U.S. Pat. Nos. 4,904,861 and 4,998,013 to Epstein et al., the utilization of suction diodes for the removal of the slow diffusion currents to reduce the settling time of detectors to acceptable levels, as described in U.S. Pat. No. 5,408,122, and providing a gradient in doping density in the epitaxial layer, as described in U.S. Pat. No. 5,430,321 to Effelsberg.

Despite attempts to improve the overall performance characteristics of photodiode arrays and their individual diode units, within detection systems, photodiode arrays capable of reducing crosstalk while being less susceptible to radiation damage are still needed. Additionally, there is need for a semiconductor circuit and an economically feasible design and fabrication method so that it is capable of improving the spatial resolution of detectors integrated therein.

SUMMARY OF THE INVENTION

The present invention is directed toward a detector structure, detector arrays, and a method of detecting incident radiation. The present invention comprises several embodiments that provide for reduced radiation damage susceptibility, decreased affects of crosstalk, reduced dark current (current leakage) and increased flexibility in application. In one embodiment, the present invention comprises a back side illuminated photodiode array with a back side etching that minimizes the active area layer, thereby decreasing the affects of crosstalk. The back side etching is preferably, but by no way of limitation, in the form of "U" or "V" shaped grooves. The back side illuminated with back side etching (BSL-BE) photodiodes are implemented in an array and have superior performance characteristics, including less radiation damage due to a thinner active area, and less crosstalk due to shorter distances for minority carriers to diffuse to the PN junction. The present invention also comprises a front side illuminated photodiode, with contact pads on the front side, further comprising isolation trenches, resulting in zero cross talk.

In one embodiment, the photodiode array comprises a substrate having at least a front side and a back side, photodiodes integrally formed in the substrate forming the array, and metal contacts provided on the front side. The fabrication of the array involves diffusing a n+ layer on the back side of the substrate, forming a deep n+ region; applying a first masking layer on the back side; applying a second masking layer on the back side; applying a photoresist mask on the back side, forming an etching pattern; using the etching pattern to etch the first masking layer, the second masking layer; removing the photoresist mask; etching the deep n+ region, and the substrate; and finally coating the back side of the substrate with an antireflective coating.

Preferably, the array substrate is made of n doped silicon. The deep n+ region and shallow n+ region may be of varied doping concentration. In addition, it is preferred that the first masking layer and the second masking layer are $SiO_2$, $Si_3N_4$, or any other similar suitable material. It is also preferred that the grooves formed in the substrate are "V"-shaped grooves. It is also preferred that the first masking layer, second masking layer, and antireflective coating form a three-layer dielectric membrane, which further forms a bridge between the grooves in the back side of the device wafer.

Optionally, the preferred embodiment of the present invention may comprise a handle wafer bonded to the front side of the device wafer, for improved strength and manageability. Front surface cathode and anode contacts are brought to the surface of the handle wafer via metallization of channels, formed from the side walls of the handle wafer.

In one embodiment, the fabrication of the photodiode array involves applying a first masking layer on the back side of the device wafer; applying a second masking layer on the back side; applying a photoresist mask on the back side, forming an etching pattern; etching the second masking layer according to the photoresist mask pattern; etching the first masking layer according to the photoresist mask pattern; removing the photoresist mask; etching the substrate, thus forming grooves in the substrate; diffusing a shallow n+ layer onto the back side of the substrate, forming a shallow n+ region; and finally, coating the back side of the substrate with an antireflective coating.

In another embodiment, the manufacture of the photodiode array of the present invention comprises applying a first masking layer on the back side; applying a photoresist mask on the back side, forming an etching pattern; etching the first masking layer according to the photoresist mask pattern; removing the photoresist mask; etching the substrate, forming grooves in said substrate; diffusing a n+ layer onto the back side of the substrate, forming a shallow n+ region; and finally, coating the back side of said substrate with an antireflective coating.

In yet another embodiment, the photodiode array of the present invention may be fabricated via the following steps: diffusing a n+ layer on the back side of the substrate, forming a deep n+ region; applying a first masking layer on the back side; applying a second masking layer on the back side; applying a photoresist mask on the back side, forming an etching pattern; first etching the second masking layer according to the photoresist mask pattern; second etching the first masking layer according to the photoresist mask pattern; removing the photoresist mask; third etching the deep n+ region and substrate, forming grooves in the substrate; diffusing a n+ layer onto the back side of the substrate, forming a shallow n+ region; and finally, coating the back side of the substrate with an antireflective coating.

In yet another embodiment of the present invention, the photodiode array comprises a substrate having at least a front side, a back side, and a handle wafer bonded to the front side, photodiodes integrally formed in the substrate forming the array; and a plurality of electrical contacts in electrical communication with said front side, wherein front surface cathode and anode contacts are brought to a top surface of said handle wafer via metallization of channels.

In another preferred embodiment of the present invention, the photodiode array comprises a substrate having at least a front side, a back side, and a handle wafer bonded to said front side, photodiodes integrally formed in the substrate forming the array, a buried oxide layer formed between the substrate and handle wafer, and a plurality of trenches operating as isolation trenches to nonconductively isolate electrically active regions. In this preferred embodiment, the photodiode array is front side illuminated and has back side contacts. The isolation trenches provide for zero cross talk.

BRIEF DESCRIPTION OF THE DRAWINGS

These and other features and advantages of the present invention will be appreciated, as they become better understood by reference to the following detailed description when considered in connection with the accompanying drawings.

DESCRIPTION OF THE INVENTION

This application hereby incorporates by reference co-pending application, entitled "FRONT ILLUMINATED BACK SIDE CONTACT THIN WAFER DETECTORS", which also relies on, for priority, U.S. Provisional Application 60/468,181, having a priority date of May 5, 2003, entitled "DETECTORS WITH IMPROVED RADIATION DAMAGE AND CROSSTALK CHARACTERISTICS". The invention described therein comprises a plurality of front side illuminated photodiodes, optionally organized in the form of an array, with both the anode and cathode contact pads on the back side. The front side illuminated, back side contact (FSL-BSC) photodiodes have superior performance characteristics, including less radiation damage, less crosstalk using a suction diode, and reliance on reasonably thin wafers. The invention, as described therein, is a photodiode array having a substrate with at least a front side and a back side; a plurality of photodiodes integrally formed in the substrate forming the array wherein each photodiode has a middle layer juxtaposed between a front layer and a back layer; a plurality of electrical contacts in electrical communication with the back side; and suction diodes positioned at selected locations within the array, wherein the fabrication of said array involves a masking process comprising the steps of applying a first p+ mask on said front side and applying a second p+ mask on said back side.

The present invention is directed toward a detector structure, detector arrays, and a method of detecting incident radiation. Various modifications to the preferred embodiment will be readily apparent to those of ordinary skill in the art, and the disclosure set forth herein may be applicable to other embodiments and applications without departing from the spirit and scope of the present invention and the claims hereto appended. Thus, the present invention is not intended to be limited to the embodiments described, but is to be accorded the broadest scope consistent with the disclosure set forth herein.

The present invention comprises several embodiments that provide for reduced radiation damage susceptibility, decreased affects of crosstalk, and increased flexibility in application. In one embodiment, the present invention comprises a back side illuminated photodiode array with a back side etching that minimizes the active area layer, thereby decreasing the affects of crosstalk. The back side etching is preferably, but by no way of limitation, in the form of "U" or "V" shaped grooves. The back side illuminated with back side etching (BSL-BE) photodiodes are implemented in an array and have superior performance characteristics, including less radiation damage due to a thinner active area, and less crosstalk due to shorter distances for minority carriers to diffuse to the PN junction.

Referring now to FIGS. 1a, 1b, 2a, and 2b, the active areas in the back side of the photodiode arrays are etched to minimize the likelihood of crosstalk while still providing the detector with sufficient strength to avoid easy breakage. FIGS. 1a, 1b, 2a, and 2b depict exemplary photodiode arrays having a first region of maximum thickness, a second region of minimum thickness, and a third region of varying thickness which depends upon the level of back side etching. The "regions" are loosely defined areas of the photodiode arrays and are described herein to illustrate the teachings of the present invention. While these regions are present in the embodiments as described in the above-mentioned figures, the specifications regarding the number of regions and their corresponding thicknesses that comprise the photodiode array are merely illustrative of the present invention and not intended to be limiting.

The first region comprises p+ regions and n+ regions that are separated by a thin active layer, minimizing the degree of crosstalk between the diodes and reducing susceptibility to radiation damage. The second region comprises a shallow n+ region and, optionally, a deep n+ region, both doped with a suitable impurity of a similar conductivity type and located close to the back side of the wafer. The second region provides the photodiode area with increased strength and resistance to breakage. The third region forms the bottom surface wall (depth) of preferably "U" or "V" shaped grooves etched into the back side of the photodiode array and spans to the front side surface of the device wafer. Ideally, the total depth of the first region would equal the total depth of the second and third regions combined.

Figure 1A:
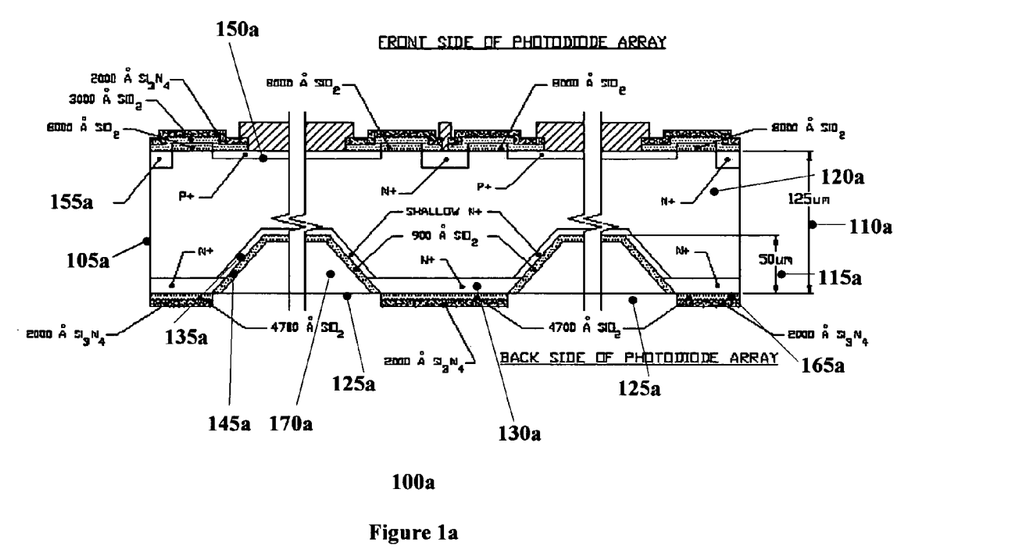
FIG. 1a is a cross sectional view of a preferred front side of one embodiment of a back side etched, front side contact photodiode array of the present invention.

In the preferred embodiment, the back side illuminated photodiode arrays of the present invention have front side contacts. Referring now to FIG. 1a, a preferred embodiment of the front side of the photodiode arrays of the present invention is depicted. Metal contact pads are provided on the front and are in electrical communication with the anode and cathode surface structures. Both regions 150a and 155a are positioned directly below the front surface of the device wafer 105a, sharing their top face with front surface of device wafer 105a. Heavily doped regions 150a and 155a may be doped with a suitable impurity of a selected conductivity type, such as p-type or n-type. Regions 150a and 155a are doped with opposite impurities of selected conductivities. For example, but not limited to such example, if region 150a is doped with a suitable impurity of selected conductivity that is p-type, then region 155a is doped with n-type. In addition, a thin region of active layer separates regions 150a and 155a. The thin active layer minimizes the degree of cross talk between diodes and reduces susceptibility to radiation damage.

Referring again to FIG. 1a, cross section 105a of one embodiment of photodiode array 100a is shown. Photodiode array 100a comprises regions, including first region 110a, second region 115a and third region 120a, with maximum, minimum, and variable thicknesses, respectively. As an example, and by no way of limitation, the three regions may possess the following specifications: first region 110a may have a thickness of approximately 125 µm, second region 115a may have a thickness of approximately 50 µm, and third region 120a may be of a varying thickness, ranging from a minimum of approximately 75 µm to a maximum of approximately 125 µm, depending on the level and pattern of etching. The above-mentioned specifications are only mentioned by way of illustration and are not binding. The specification can be easily changed to suit the design, fabrication, and functional requirements suggested herein.

First region 110a comprises two heavily doped regions, 150a and 155a, as described above. First region 111a is separated into two additional regions for ease of discussion—second region 115a and third region 120a. Second region 115a, in a preferred embodiment, comprises shallow n+ regions 135a and deep n+ regions 130a, both doped with a suitable impurity of a similar conductivity type and located close to the back side of the wafer. Both shallow n+ regions 135a and deep n+ regions 130a may optionally be heavily doped with an impurity of similarly selected conductivity type, such as p-type or n-type. A large active area fills the depth created at the junction of both shallow n+ region 135a and deep n+ region 130a. For example, and by no way of limitation, shallow n+ region 135a is preferably 0.3 µm in thickness and deep n+ region 130a is preferably 2 µm in thickness. Second region 115a provides the photodiode array with increased strength and resistance to breakage. Third region 120a, in combination with second region 115a, forms "U" or "V" shaped etchings in the back side of photodiode (depending on the type of etching used).

Figure 2A:
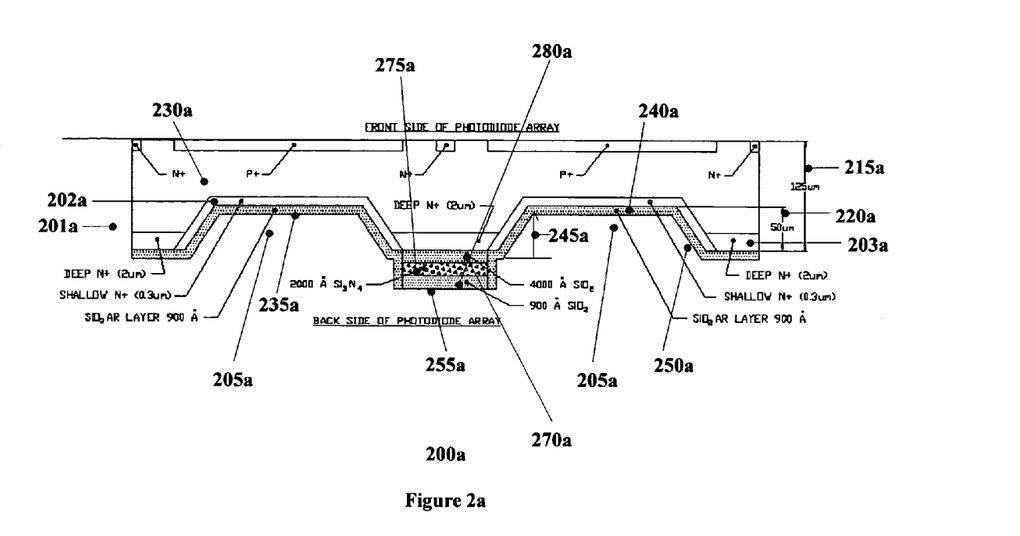
FIG. 2a is cross sectional view of a preferred embodiment of the back side of a back side etched, front side contact photodiode array of the present invention.

Referring now to FIG. 2a, a cross sectional view of a preferred embodiment of a single crystal semiconductor substrate or device wafer 201a having a plurality of photodiodes positioned in an array 200a therein is depicted. Note that the front side of photodiode array 200a is as depicted and described above with reference to FIG. 1a. Device wafer 201a comprises three regions, including first region 215a, second region 220a, and third region 230a, with maximum, minimum, and variable thicknesses, respectively. Various constructional details with respect to the regions in photodiode array 200a have been explained with reference to FIG. 1a above and will not be discussed here. General dimensions and relevant specifications, however, are discussed in the following paragraph and are by no way limiting to the design of this preferred embodiment of the present invention.

Referring back to FIG. 2a, first region 215a is preferably of a thickness of approximately 125 µm and further comprises a p+ region and an n+ region, separated by a thin active layer just below the front side of device wafer 201a. Second region 220a preferably has a minimum thickness 50 µm and preferably comprises a shallow n+ region 202a and a deep n+ region 203a, both doped with a suitable impurity of a similar conductivity type. Shallow n+ region 202a is preferably 0.3 µm in thickness and deep n+ region 203a is preferably 2 µm in thickness—both located close to the back side of device wafer 201a. Deep n+ region 203a serves to reduce dark leakage current in the photodiode array.

Device wafer 201a may be made up of various materials, and is preferably, but not limited to Si or Ge. The crystal orientation of wafer 201a is preferably <1-0-0>. The back side of device wafer 201a is selectively etched, at appropriate positions via a suitable etching technique to form three dimensional (hereinafter, "3-D") microstructures therein, thus minimizing the active area layer and decreasing the affects of crosstalk. The grooves are preferably "U" or "V" shaped with a depth of approximately 50 μm from the back surface. The present invention may employ various other 3-D microstructures of varying shapes and dimensions including, but not limited to, grooves, pyramidal pits, pyramidal cavities etc. for minimizing active area layers. Such various other microstructures will be readily apparent to one of ordinary skill in the art having the benefit of this disclosure. The above specifications are not limiting with respect to the 3-D microstructures and their accompanying dimensions can be changed to suit any design, fabrication, and functional requirements.

For example, and by no way of limitation, a wet etching technique is used to form concave "V"-shaped grooves on the back side of device wafer 201a, at suitable positions, such as positions 205a, as shown in FIG. 2a. Via such wet etch technique, mono-crystalline wafers etch faster in certain crystallographic directions than in others, thereby allowing for certain layers or portions of the wafer to act as a "stop" for the etch process. This involves both a selection of appropriate wafer orientation and a suitable mask pattern for the photographic mask. Optionally, reactive ion etching (RIE) may be used to form concave grooves on the back side of device wafer 201a. The grooves formed via this technique, however, form "U"-shaped grooves. The sidewalls of such grooves are more vertical, wherein the wall is angled at less than 10 degrees.

As shown in FIG. 2a, portions of the back side of photodiode array 200a comprise three layers, forming dielectric membrane 255a. Three-layer dielectric membrane 255a forms a bridge between V-shaped grooves 235a. First layer 270a is comprised of $SiO_2$ and is preferably of a thickness of 4000 Å. $Si_3N_4$ comprises second layer 275a and is preferably of a thickness of 2000 Å. Third layer 280a of dielectric membrane 255a is comprised of $SiO_2$, as an antireflective coating, and is preferably of a thickness of 900 Å. A person of ordinary skill would appreciate that the specifications and dimensions of the components of the dielectric membrane are not limited to the abovementioned specifications and can be easily adjusted to suit varied economical, technical or operational specifications.

"V"-shaped grooves 235a etched into device wafer 201a form bottoms 240a, created at a depth 245a of the "V"-shaped groove from the backside of device wafer 201a. Sidewalls 250a extend from bottom 240a to the back side of device wafer 201a, at an angle. Preferably, "V"-shaped grooves 235a are of a depth of approximately 50 μm (depicted as 245a) and are located at a distance of approximately 75 μm from the front side of wafer 201a. A person of ordinary skill would appreciate that the specifications and dimensions of the "V"-shaped grooves etched into the wafer are not limited to the above-mentioned specifications and can be easily adjusted to suit varied economical, technical or operational specifications.

As a first manufacturing step, back side of device wafer 201a is heavily doped via phosphorus diffusion or high dose implantation, followed by deep driving, thus obtaining a deep n+ doped region 203a. Subsequent to the formation of the deep n+ doped region, back side of device wafer 201a is first coated with first layer 270a of a suitable masking material. Preferably, first masking layer 270a is fabricated from a material such as $SiO_2$ and in a thickness of 4000 Å. Back side of device wafer 201a is then coated with second layer 275a, comprising $Si_3N_4$, and preferably of a thickness of 2000 Å. A person of ordinary skill in the art would appreciate that the utilization of materials for the fabrication of first and second masking layers are not limited to $SiO_2$ or $Si_3N_4$, and can easily be changed to suit other design or operational requirements.

Once first layer 270a and second layer 275a are applied to back side of device wafer 201a, the back side is coated with a conventional photoresist mask, thus forming a window pattern on the back side of wafer 201a. The photoresist mask is formed using any of the conventional photolithographic techniques including, but not limited to, optical, UV (i.e. ultraviolet), EUV (i.e. enhanced ultraviolet) photolithography, e-beam or ion-beam lithography, x-ray lithography, interference lithography, or any other similar technique. Second layer 275a is then etched in accordance with the formed window pattern, using a dry etching (gas) process. First layer 270a acts as a stop etch layer in the dry etch process, as the process passes through $SiO_2$ at a significantly slower rate than $Si_3N_4$. First layer 270a is then etched according to the window pattern via the use of buffered $HF_3$, thereby exposing device wafer 201a, coated with deep n+ regions 203a through the pattern achieved via the use of the photoresist mask. The photoresist mask is then removed from the back side of the wafer, prior to etching the grooves in the substrate, as the wet etchant would damage the photoresist mask. As an alternative, the $Si_3N_4$ layer and pattern already formed in the previous steps functions as the etch mask.

"V"-shaped grooves are then etched into device wafer 201a and deep n+ regions 203a, through the use of a wet (chemical) etch process. It is preferable to use KOH in the chemical etch process of this step. It must be noted here that the etch rate of the silicon wafer is orientation dependent—the more slowly etched crystal planes form the side and end walls of the V-grooves. Device wafer 201a is preferably a wafer having a crystal orientation <1-0-0>. V-shaped grooves etched parallel to the <1-1-0> direction have planar facets which bind the V-shaped grooves, lying in the <1-1-1> plane. The planar facets are inclined at an angle of 54.7° with respect to the <1-0-0> plane. The groove sizes are controlled by the corresponding mask windows, the accuracy of their alignment with the crystal axes, the erosion rate of the edges of the mask, and the relative etch rates of the crystal planes. Typically, the finished widths of V-grooves can be controlled to within 0.5 to 1 μm. Manufacturing methods of 3-D microstructures, such as concave cavities or grooves, of various shapes and textures in semiconductor substrates are well known in the art. Orientation selective wet etching techniques including, but not limited to, isotropic, anisotropic etching, etc. are preferred. Like other conventional etching techniques, orientation selective wet etching techniques also utilize custom-made or conventional mask patterns. Preferably, a "V"-shaped groove pattern, formed on a suitable photographic mask in accordance with the principles of the present invention, is used to protect one area of the wafer 201a during the stripping and etching processes. The present invention, however, is directed towards providing preferred methods of masking and etching the active area, thereby used to minimize the likelihood of crosstalk while still providing the detector with sufficient strength to avoid easy breakage. The scope and spirit of the invention is no way limited, and other 3-D microstructures may be etched into the back side of wafers in accordance to the preferred properties of the present invention.

After "V"-shaped grooves are etched into the device wafer shallow n+ layer 202a is diffused onto the back side of device wafer 201a. The back side of device wafer 201a, including the surface of V-shaped grooves 235a, is then coated with layer 280a, an antireflective coating. Various antireflective coating designs, such as 1 layer, 2 layer, 3 layer, and 4+ layers may be employed. By way of example, and by no means limiting, the 1-layer antireflective coating design adopted herein utilizes thin film materials, such as oxides, sulfides, fluorides, nitrides, selenides, metals, among others. In a preferred embodiment of the present invention, layer 280a comprises $SiO_2$ AR (i.e. silicon dioxide antireflective). Preferably, the $SiO_2$ AR layer has a thickness of 900 Å.

Figure 2B:
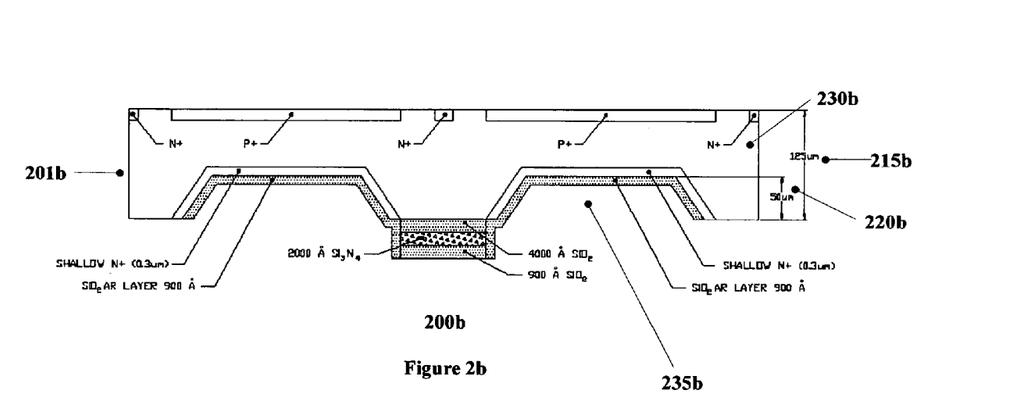
FIG. 2b is a cross sectional view of one embodiment of the back side of a back side etched, front side contact photodiode array of the present invention.

Referring now to FIG. 2b, the back side of another embodiment of the present invention is depicted. Note that the front side of photodiode array 200b has already been described above with respect to FIG. 1a. Device wafer 201b comprises three regions, including first region 215b, second region 220b, and third region 230b, with maximum, minimum, and variable thicknesses, respectively. By way of comparison with FIG. 2a, FIG. 2b depicts a cross section of photodiode array 200b without deep n+ region (shown as 203a in FIG. 2a). Third region 230b is of a varying thickness and in combination with second region 220b, constitutes "U"-shaped or "V"-shaped etchings 235b in the back side of wafer 201b. Various constructional details with respect to the three regions in photodiode array 200b have been explained with reference to FIGS. 1a and 2a and will not be discussed here. It should be noted, however, that the first manufacturing step as described with respect to FIG. 2a is omitted in the manufacture of photodiode array 200b due to the omission of the deep n+ region.

Now, referring back to FIG. 1a, the back side of yet another embodiment of the back side of the photodiode array of the present invention is depicted. Note that front side characteristics and optimal dimensions with respect to FIG. 1a have already been discussed above. Device wafer 105a may be made up of various materials, and is preferably, but not limited to Si or Ge. The crystal orientation of wafer 105a is preferably <1-0-0>. Back side of device wafer 105a is selectively etched, at appropriate positions via a suitable etching technique to form three dimensional (hereinafter, "3-D") microstructures therein, thus minimizing the active area layer and decreasing the affects of crosstalk. The grooves are preferably "U" or "V" shaped with a depth of approximately 50 μm from the back surface. The present invention may employ various other 3-D microstructures of varying shapes and dimensions including, but not limited to, grooves, pyramidal pits, pyramidal cavities etc. for minimizing active area layers. Such various other microstructures will be readily apparent to one of ordinary skill in the art having the benefit of this disclosure. The above specifications are not limiting with respect to the 3-D microstructures and their accompanying dimensions can be changed to suit any design, fabrication, and functional requirements.

For example, and by no way of limitation, a wet etching technique is used to form "V" shaped grooves on the back side of device wafer 105a, at suitable positions, such as positions 125a, as shown in FIG. 1a. Via such wet etch technique, monocrystalline wafers etch faster in certain crystallographic directions than in others, thereby allowing for certain portions of the wafer to act as a "stop" for the etch process. This involves both a selection of appropriate wafer orientation and a suitable mask pattern for the photographic mask. Optionally, reactive ion etching (RIE) may be used to form concave grooves on the back side of device wafer 105a. The grooves formed via this technique, however, form "U"-shaped grooves. The sidewalls of such grooves are more vertical, wherein the wall is angled at less than 10 degrees.

As a first manufacturing step, back side of device wafer 105a is heavily doped via phosphorus diffusion or high dose implantation, followed by deep driving to obtain a deep n+ doped region 130a. First layer 140a, of a suitable masking material, is then thermally grown onto the back side of device wafer 105a. Preferably, the first masking layer is fabricated from a material such as $SiO_2$ and in a thickness of 4700 Å. Back side of device wafer 105a is then coated with second layer 165a, comprising deposited $Si_3N_4$, and preferably of a thickness of 2000 Å. A person of ordinary skill in the art would appreciate that the utilization of materials for the fabrication of first and second masking layers are not limited to $SiO_2$ or $Si_3N_4$, and can easily be changed to suit other requirements.

Once first layer 140a and second layer 165a are applied to back side of device wafer 105a, the back side is coated with a conventional photoresist mask, thus forming a window etch pattern. The photoresist mask is formed using any of the conventional photolithographic techniques including, but not limited to, optical, UV (i.e. ultraviolet), EUV (i.e. enhanced ultraviolet) photolithography, e-beam or ion-beam lithography, x-ray lithography, interference lithography, or any other similar technique. Second layer 165a is then etched in accordance with the formed window pattern, using a dry etching (gas) process. First layer 140a acts as a stop etch layer in the dry etch process, as the process passes through $SiO_2$ at a significantly slower rate than $Si_3N_4$. First layer 140a is then etched in the window pattern via the use of buffered $HF_3$, thereby exposing device wafer 105a and deep n+ regions 130a through the window pattern achieved via the use of the photoresist mask.

The photoresist mask is then removed from the back side of the wafer, prior to etching the grooves in the substrate, as the wet etchant would damage the photoresist mask. As an alternative, the $Si_3N_4$ layer and pattern already formed in the previous steps functions as the etch mask.

"V"-shaped grooves 170a are then etched into device wafer 105a, first removing doped n+ deep regions 130a. After "V"-shaped grooves are etched into the device wafer shallow n+ layer 135a is diffused onto the back side of device wafer 105a, coating only the surface of V-shaped grooves 170a. The surface of V-shaped grooves 170a is then coated with layer 145a, an antireflective coating. Various antireflective coating designs, such as 1 layer, 2 layer, 3 layer, and 4+ layers may be employed. By way of example, and by no means limiting, the 1-layer antireflective coating design adopted herein utilizes thin film materials, such as oxides, sulfides, fluorides, nitrides, selenides, metals, among others. In a preferred embodiment of the present invention, layer 145a comprises $SiO_2$ AR (i.e. silicon dioxide antireflective). Preferably, the $SiO_2$ AR layer has a thickness of 900 Å.

Figure 1B:
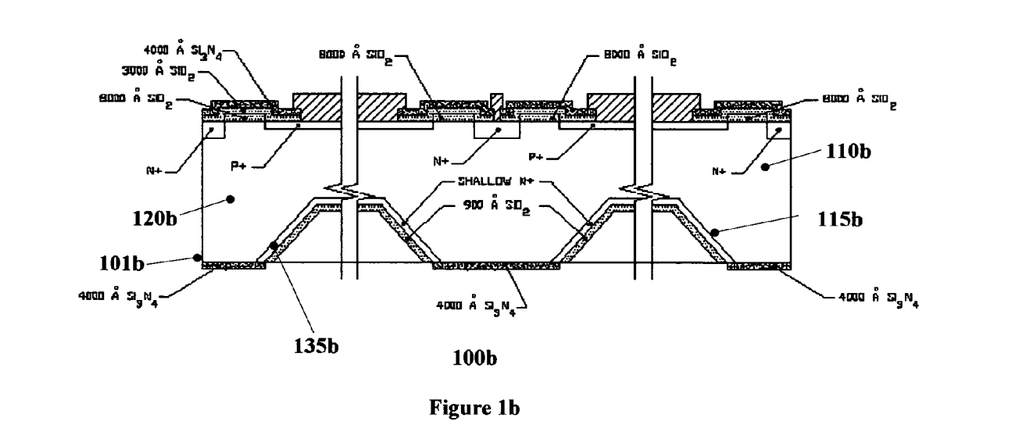
FIG. 1b is a cross sectional view of one embodiment of a back side etched, front side contact photodiode array of the present invention, also illustrating a preferred front side of the present invention.

Referring now to FIG. 1b, a second preferred embodiment of a photodiode array 100b is depicted. Photodiode array 100b comprises first region 110b, second region 115b, and third region 120b, preferred dimensional details of which are discussed above with reference to FIG. 1a. In addition, the doping materials used, masking layers formed, and etching techniques adopted to form the 3-D microstructures have already been explained above with reference to FIG. 1a. In the manufacture of photodiode array 100b, however, only a single first masking layer is applied to the back side of the photodiode array. For example, and by no way of limitation, the single masking layer 165b is preferably $Si_3N_4$ and of a thickness of 4000 Å. In addition, second region 115b comprises only a shallow n+ region 135b.

Figure 3:
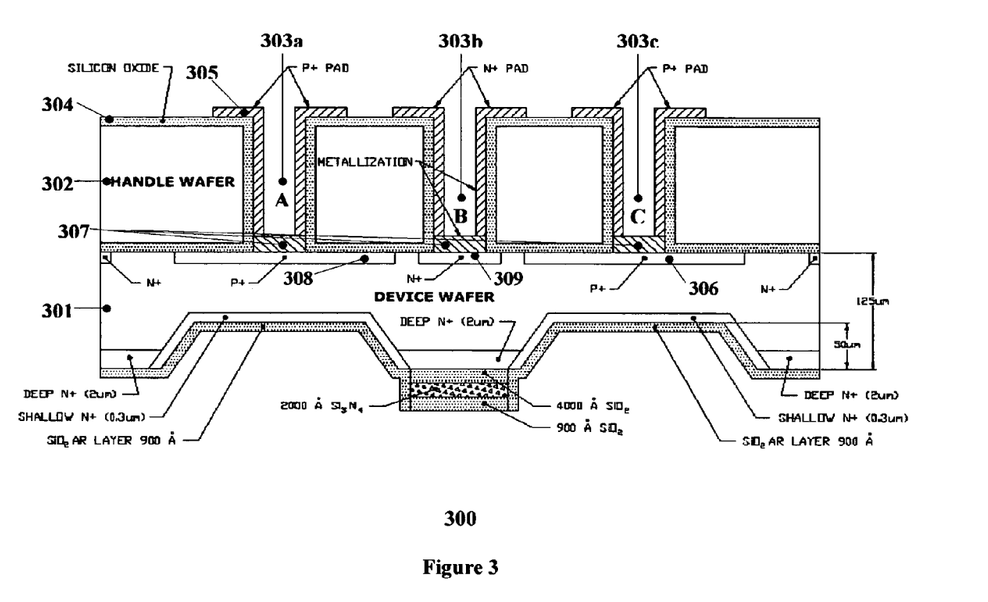
FIG. 3 depicts a back side illuminated, front side contact photodiode array of the present invention, further comprising a handle wafer, for improved strength and manageability.

Referring to FIG. 3, another preferred embodiment of the photodiode array of the present invention is illustrated. The back side illuminated, front side contact (BSL-FSC) photodiodes are implemented in an array and have superior) performance characteristics, including low dark current (current leakage), very high shunt resistance, less crosstalk, and less radiation damage due to a thinner active area. To improve strength and manageability, the photodiode as shown in FIG. 3 further comprises a handle wafer. The front surface cathode and anode contacts are brought to the surface of the handle wafer through the metallization of channels connecting a p+ metal pad to the p+ region and an n+ metal pad to the n+ region. The starting material for photodiode array 300 is device wafer 301 with handle wafer 302 bonded to the front surface of device wafer 301.

Handle wafer 302 has channels 303a, 303b, and 303c (hereinafter referred to collectively as "303") formed in handle wafer 302 at three preferred positions, for example and by no means limiting, those marked "A", "B", and "C". Starting precisely from the top surface of handle wafer 302, channels 303 extend through the total depth of handle wafer 302 to the front side of the device wafer 301. The side walls of the handle wafer 302 define channels 303. Handle wafer 302 is coated with a first layer 304 and a second layer 305, both forming top and sidewalls of handle wafer 302. First oxide insulation layer 304 coats the inner walls of channels 303. For example, but not limited to such example, $SiO_2$ may be used for the first oxide insulation layer 304. Second layer 305, layered on top of first layer 304, coats a major portion of the inner walls forming channels 303 and at least partially covering the top surface of handle wafer 302. Second layer 305, a heavily doped pad layer of a selected conductivity type, in conjunction with layer 304 coats inner walls which form channels 303. Preferably, second layer 305 is either p+ doped or n+ doped. Second layer 305 in channel 303 at area "B" uses a n+ doped pad wherein p+ doped pads are used at areas "A" and "C".

Channels 303, having first layer 304 and second layer 305 coating side walls of handle wafer 302 and forming inner walls of channel 303, are vertically aligned with respect to layers 306, 308, and 309. Further second layer 305 (vertical p+ pad in this preferred embodiment) in channels 303 comprising areas "A" and "C" covers a large portion, preferably a substantial portion of the depth of channel 303 (or the portion that substantially forms the depth of handle wafer 302). Bottom layers 306 and 308 are in electrical communication with horizontal p+ pads 307 as depicted in the cross-sectional view of FIG. 3. In channel 303 comprising area "B", horizontal n+ pad 307 is electrically connected to n+ region 309.

Areas between second layers 305 (either p+ or n+), running along the sidewalls of handle wafer 302 and forming channels 303, can be described as void areas "A", "B", and "C". Due to metallization of channels 303 along the entire periphery of the vertical sidewall layer 305 and the horizontal pads 307 therein, the front surface cathode and anode contacts on device wafer 301 are brought to the surface of the handle wafer 302 with channels 303 connecting the p+ metal pads to the p+ regions and the n+ metal pads to the n+ regions.

The back side of device wafer 301, as shown in FIG. 3, has already been described in a preferred embodiment with respect to FIG. 2a. The description as offered in FIG. 2a is herein incorporated by reference.

Various other methods of physically separating active regions of photodiode arrays may be readily apparent to a person of ordinary skill in the art. It should be noted that the above description about separation of active regions of individual photodiodes, via formation of insulation layers there between, is merely for illustrative purposes and not intended to limit the applicability of the present invention.

Figure 4A:
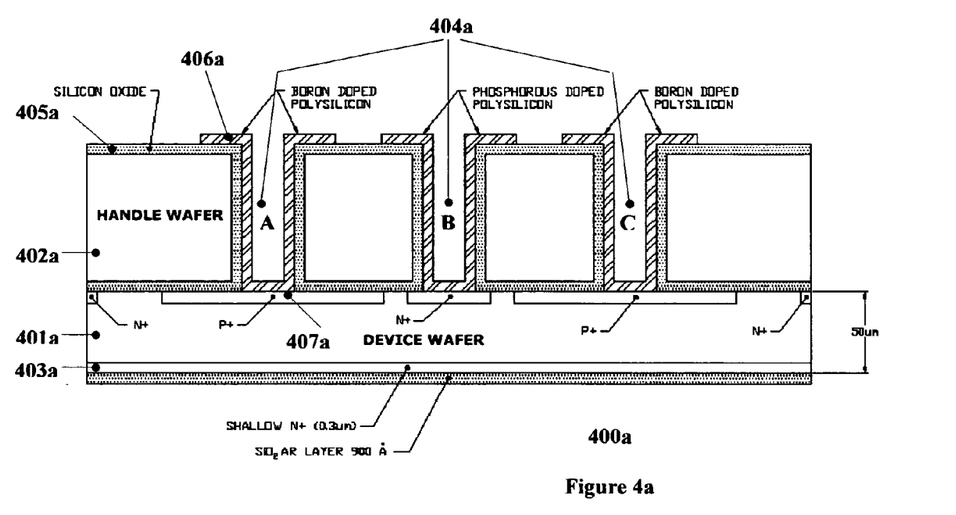
FIG. 4a depicts a back side illuminated, front side contact photodiode array of the present invention, further comprising a handle wafer.
Figure 4B:
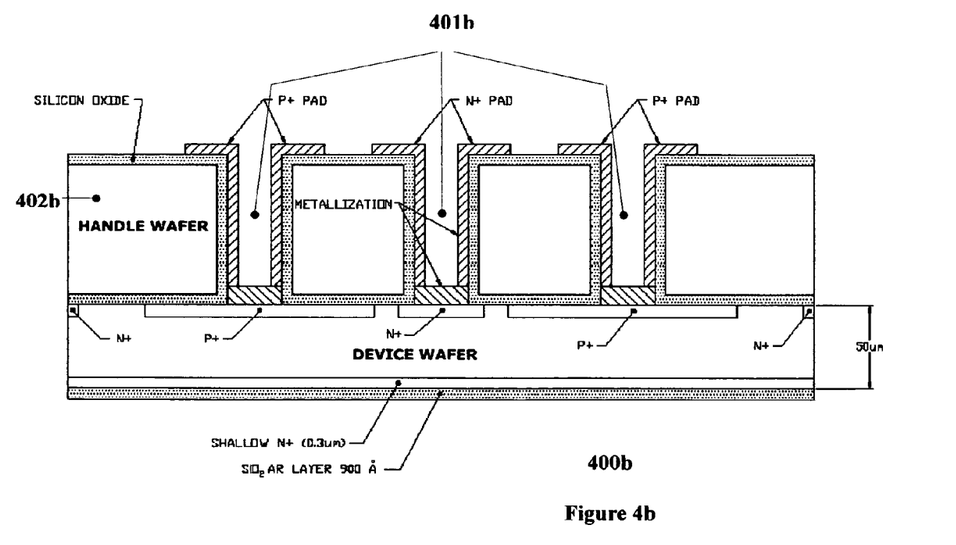
FIG. 4b depicts a back side illuminated, front side contact photodiode array of the present invention, further comprising a handle wafer.

Referring now to FIGS. 4a and 4b, additional preferred embodiments of the back side illuminated-front side contact photodiode arrays are shown. The BSL-FSC photodiodes have thin active layers, thereby improving crosstalk characteristics and reducing susceptibility to radiation damage. A plurality of p+ and n+ regions are separated by a shallow active region. To improve strength and manageability, the photodiode further comprises a handle wafer. The front surface cathode and anode contacts are brought to the surface of the handle wafer through the metallization of channels connecting a p+ metal pad to the p+ region and an n+ metal pad to the n+ region.

Referring now to FIG. 4a, a cross sectional view of one embodiment of the present invention is shown. As an example, and by no way of limitation, silicon may be utilized in accordance with the principles of the present invention. The starting material for the BSL-FSC photodiode is a silicon wafer comprising a device wafer 401a bonded to a handle wafer 402a using a suitable bonding material via an appropriate method of bonding silicon wafers. Such bonding methods are well known to one of ordinary skill in the art. Both device wafer 401a and handle wafer 402a are preferably formed of the same semiconductor material of a selected conductivity type, such as p-type or n-type. The device wafer 401a preferably has a thickness of approximately 50 μm.

Handle wafer 402a increases strength in the BSL-FSC photodiode while improving manageability. The front surface cathode and anode contacts are brought to the top surface of the handle wafer 402a through the metallization of channels 404a connecting a p+ pad to the p+ region and a n+ pad to the n+ region. Channels 404a, formed in handle wafer 402a are marked with area designations "A", "B", and "C". The inner side walls of handle wafer 402 forming channels 404a comprise first layer 405a, which is an oxide insulation layer and second layer 406a, which is a contact layer for handle wafer 402a. Material selection and manufacturing method for such layers have already been described with reference to FIG. 3 and will not be described in detail here.

As shown in FIG. 4a, boron doped polysilicon is preferably used as the material for second layer 406a, and define defining channel areas "A" and "C", in conjunction with first layer 405a and bottom wall 407a. A person of ordinary skill in the art would readily appreciate that the selection and utilization of material for the second sidewall layer is not limited to boron doped polysilicon and can be changed to suit varied technical and operational specifications. Second sidewall layer 406a defining channel area "B" preferably comprises, but is not limited to phosphorus doped polysilicon.

Also depicted in FIG. 4a is a plurality of selected p+ and n+ doped regions separated from a substantially uniform shallow n+ layer 403a by a thin active region. Portions of the thin active region or layer are also juxtaposed between the plurality of p+ and n+ regions. The shallow n+ layer 403a improves the quantum efficiency at shorter wavelengths and reduces dark current (current leakage) of the photodiode.

Referring now to FIG. 4b, a cross sectional view 400b of another preferred embodiment of the BSL-FSC photodiode is shown. The preferred specifications of the BSL-FSC photodiode are described above with respect to cross section 400a of FIG. 4a. In contrast, however, FIG. 4b employs p+ metal pad layers and n+ metal pad layers as the sidewalls that define channels 401b. FIG. 4b shows front surface cathode and anode contacts, brought to the surface of handle wafer 402b through the metallization of channels 401b connecting a p+ metal pad to the p+ region and an n+ metal pad to the n+ region.

Figure 5A:
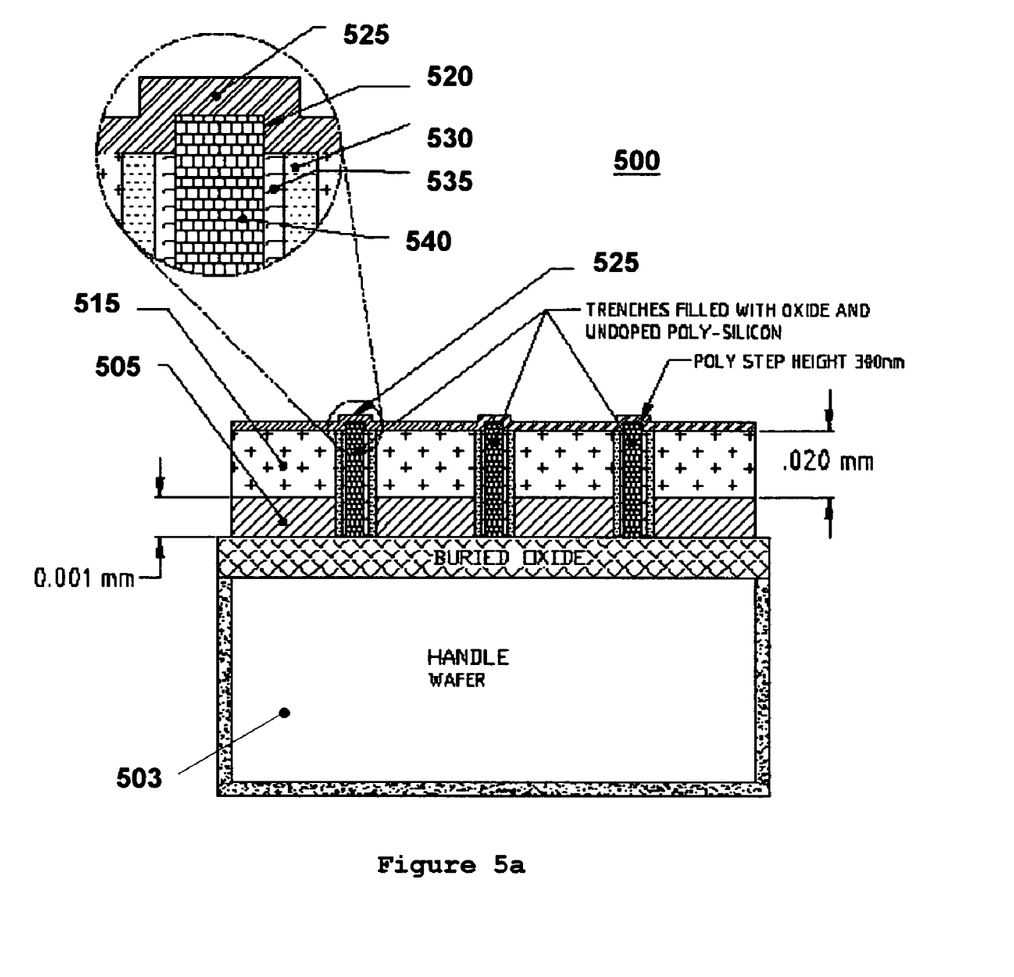
FIGS. 5a, 5b, and 5c depict different views of an array of photodiodes with a plurality of trenches functioning as isolation trenches, to non-conductively isolate electrically active regions from each other.
Figure 5B:
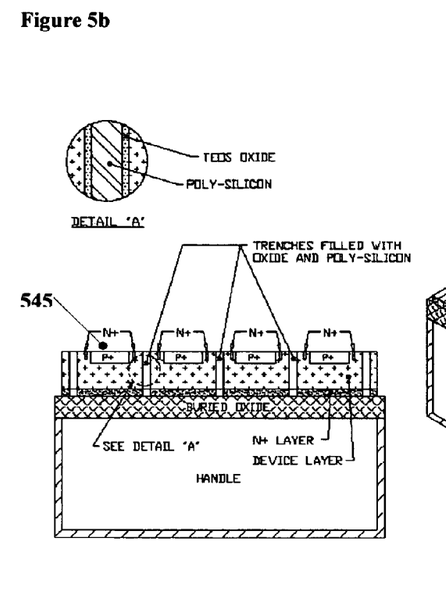
Figure 5C:
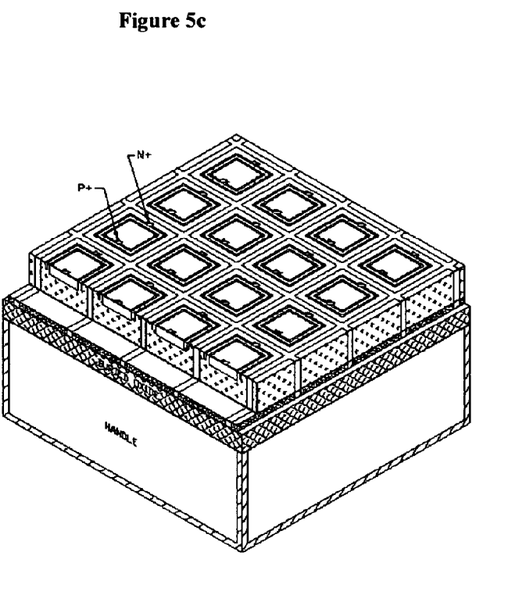

In another embodiment, the present invention comprises a front side illuminated photodiode array with zero crosstalk due to dielectric isolation. The front side illuminated, zero crosstalk (BSL-ZC) photodiodes are implemented in an array and have superior performance characteristics, including less radiation damage due to a thinner active area and zero crosstalk due to a complete isolation of the carrier regions. FIGS. 5a, 5b, and 5c depict different views of an array of photodiodes with a plurality of trenches functioning as isolation trenches, to non-conductively isolate electrically active regions from each other.

Specifically, FIG. 5a depicts one such exemplary trench, functioning as an isolation trench. A device layer 515 is in physical communication with a trench defined by a doped trench sidewall 530, a trench sidewall liner 535, preferably an oxide, and polysilicon 540 as a filler. The trench is further defined by a polysilicon step 520, preferably having a height at or around 300 nm, and a TEOS trench endpoint 525, preferably having a height at or around 500 nm. In one embodiment, the trench has a width at or around 2.5 μm to 4 mu. In the above-mentioned embodiment, various specifications for device wafer thicknesses and trench widths are provided. The provided specifications are not limiting with respect to device wafer thicknesses and trench widths and their accompanying dimensions can be changed to suit any design, fabrication, and functional requirements.

Trench sidewall 530 is of n-type (phosphorous) doping, if the device layer material is also n-type. The doping type of the trench sidewall layer matches that of the device layer. Sheet resistance of the trench sidewall doping is less than 50 ohm per square. The trench sidewall liner thickness, for each sidewall, is 150 nm+/−35 nm. The polysilicon 540 filled trench isolated photodiode array 500 eliminates electrical migration between the adjacent detecting regions therein, thereby preventing minority carrier leakage current and achieving zero crosstalk characteristics.

Custom silicon-on-insulator (SOI) starting material for photodiode array 500 of the present invention is a device layer 515 with a buried layer 505 formed on top of a buried oxide (BOX) layer, resting on a handle wafer 503. Handle wafer 503 can be of any type as is well known to those of ordinary skill in the art, ranging from handle wafers of low resistivity to handle wafers of high resistivity. Additionally, low cost handle wafers may be employed. Also, handle wafers of optimal performance can be used. Handle wafer 503 is doped with an impurity of a selected conductivity type, either n-type or p-type and preferably has a thickness of approximately 300–700 μm.

Handle wafer 503 is oxidized, thereby forming a buried oxide layer surrounding the handle wafer. Device layer 515 is preferably a double-sided polished wafer (to improve bonding characteristics) and is subjected to shallow n+ diffusion or ion implantation, thereby forming layer 505 on the back side of device layer 515. The front side of handle wafer 503, covered with the oxide layer, is then bonded to the backside of device layer 515, which has an original thickness of 400 μm. The BOX layer is used for the bonding process.

Device layer 515 is preferably formed of the same semiconductor material as handle wafer 503 and is ground and polished to a preferred thickness of 20 μm. It is ground and polished to such desired thickness. Optionally, device layer 515 may be grown as an epitaxial layer on top of handle wafer 503. The positioning of the trenches is then formed using a standard photolithography step, as mentioned above, thereby obtaining a pattern on the thinned wafer. Using the photoresist pattern, a dry etching technique, such as reactive ion etching is then used to etch the silicon wafer for trench formation. The photoresist layer is removed following the step of silicon trench etching.

Trench sidewall 530 is deposited via, but not limited to, a thermal deposition technique. The sidewall oxide layer 535 is then formed along the vertical wall of the trench. The wafers are then subjected to polysilicon deposition, thereby filling the trenches with polysilicon. It is preferred that the trenches in this preferred embodiment of the present invention are filled after the growth of trench sidewall liner 535, so that the polysilicon 540 filler is more likely to be void free. In the final step, a TEOS oxide layer is deposited on the surface.

Referring now to FIGS. 5b and 5c, an array of photodiodes affixed to a handle wafer 503 with a layer of buried oxide therebetween is shown. Note that photodiode array 500 is front side illuminated because the presence of the buried oxide layer will act as an impenetrable barrier to a light generated carrier. Each photodiode has surface n+ and surface p+ regions separated from a base n+ region by an active layer and are separated from adjacent photodiodes by a trench acting as an isolating layer. Spaced semiconductor regions 545 are formed in device layer 515 via standard semiconductor processing, masking and etching techniques, as are well known to those of ordinary skill in the art. A boundary between the device layer wafer 515 and each spaced region 545 defines a p-n junction (not shown).

Of particular advantage, the present invention provides a method for filling an isolation trench or other semiconductor structure whose active areas require a non-conductive material, typically but not limited to undoped $SiO_2$, to physically and non-conductively isolate said electrically active regions.

The above discussion is aimed towards providing a preferred embodiment incorporating the novel aspects of the present invention and it should be understood that the foregoing illustration is not the only application where the present invention can be reduced down to practice. The present invention can be suitably modified to incorporate other possible embodiments as well. The scope of the invention is defined solely by the accompanying claims and within the scope of the claims; the present invention can be employed in various other situations. For example, other device-to-device isolation, active are patterning, active area reduction, reduction of crosstalk, formation of electrical contacts via through holes, and reduction of radiation damage techniques could be employed while still staying within the scope of the present invention.

What is claimed is:

1. A photodiode array comprising:
a substrate having at least a front side and a back side;
a plurality of photodiodes integrally formed in the substrate forming said array;
a plurality of metal contacts provided on said front side, wherein the fabrication of said array comprises:

diffusing a n+ layer on said back side of said substrate forming a deep n+ region;

applying a first masking layer on said back side;

applying a second masking layer on said back side;

applying a photoresist mask on said back side, forming an etching pattern;

first etching said second masking layer according to said photoresist mask pattern;

second etching said first masking layer according to said photoresist mask pattern;

removing said photoresist mask;

third etching said deep n+ region and said substrate, forming grooves in said substrate;

diffusing a n+ layer onto said back side of said substrate, forming a shallow n+ region; and coating said back side of said substrate with an antireflective coating, wherein said first masking layer, said second masking layer, and said antireflective coating form a three-layer dielectric membrane and wherein said membrane forms a bridge between said grooves in said back side.

2. The array of claim 1, wherein said antireflective coating layer is silicon dioxide.

3. A photodiode array comprising:

a substrate having at least a front side and a back side;

a plurality of photodiodes integrally formed in the substrate forming said array;

a plurality of metal contacts provided on said front side, wherein the fabrication of said array comprises:

diffusing a n+ layer on said back side of said substrate forming a deep n+ region;

applying a first masking layer on said back side;

applying a second masking layer on said back side;

applying a photoresist mask on said back side, forming an etching pattern;

first etching said second masking layer according to said photoresist mask pattern;

second etching said first masking layer according to said photoresist mask pattern;

removing said photoresist mask;

third etching said deep n+ region and said substrate, forming grooves in said substrate;

diffusing a n+ layer onto said back side of said substrate, forming a shallow n+ region; and coating said back side of said substrate with an antireflective coating wherein a handle wafer is bonded to said front side.

4. The array of claim 3, wherein front surface cathode and anode contacts are brought to a surface of said handle wafer via metallization of channels.

5. The array of claim 4, wherein said channels are formed from side walls of said handle wafer.

6. The array of claim 5, wherein said side walls forming said channels comprise a first layer and a second layer.

7. The array of claim 6, wherein said first layer comprises an oxide insulation layer.

8. The array of claim 6, wherein said second layer comprises a heavily doped pad layer of a selected conductivity type of either p+ doped or n+ doped.

9. A photodiode array comprising:

a substrate having at least a front side and a back side;

a plurality of photodiodes integrally formed in the substrate forming said array;

a plurality of metal contacts provided on said front side, wherein the fabrication of said array comprises:

applying a first masking layer on said back side;

applying a second masking layer on said back side;

applying a photoresist mask on said back side, forming an etching pattern;

first etching said second masking layer according to said photoresist mask pattern;

second etching said first masking layer according to said photoresist mask pattern;

removing said photoresist mask;

third etching said substrate, forming grooves in said substrate;

diffusing a shallow n+ layer onto said back side of said substrate, forming a shallow n+ region; and coating said back side of said substrate with an antireflective coating wherein said membrane forms a bridge between said grooves in said back side.

10. The array of claim 9, wherein said antireflective coating layer is silicon dioxide.

11. A photodiode array comprising:

a substrate having at least a front side, a back side, and a handle wafer bonded to said front side;

a plurality of photodiodes integrally formed in the substrate forming said array; and a plurality of electrical contacts in electrical communication with said front side, wherein front surface cathode and anode contacts are brought to a top surface of said handle wafer via metallization of channels wherein said channels are formed from side walls of said handle wafer and wherein said channels connect a p+ metal pad to the p+ region and an n+ metal pad to the n+ region.

12. The array of claim 11, wherein said side walls of said handle wafer comprise a first layer and a second layer.

13. The array of claim 12, wherein said first layer comprises an oxide.

14. The array of claim 12, wherein said second layer is boron doped polysilicon.

15. The array of claim 12, wherein said second layer is phosphorus doped polysilicon.

16. The array of claim 12, wherein said second layer is a p+ metal pad.

17. The array of claim 12, wherein said second layer is an n+ metal pad.

* * * * *